(12) United States Patent
Kim

(10) Patent No.: US 10,004,113 B2
(45) Date of Patent: Jun. 19, 2018

(54) HEATING WIRE ARRANGEMENT FOR CERAMIC HEATER

(71) Applicant: KSM COMPONENT CO., LTD, Gimpo-si, Gyeonggi-do (KR)

(72) Inventor: Yun Ho Kim, Seoul (KR)

(73) Assignee: KSM Component Co., LTD, Gyeonggi-do (KR)

( * ) Notice: Subject to any disclaimer, the term of this patent is extended or adjusted under 35 U.S.C. 154(b) by 602 days.

(21) Appl. No.: 14/401,762

(22) PCT Filed: May 10, 2013

(86) PCT No.: PCT/KR2013/004120
§ 371 (c)(1),
(2) Date: Nov. 17, 2014

(87) PCT Pub. No.: WO2013/172596
PCT Pub. Date: Nov. 21, 2013

(65) Prior Publication Data
US 2015/0173127 A1    Jun. 18, 2015

(30) Foreign Application Priority Data

May 18, 2012  (KR) .................. 10-2012-0053160

(51) Int. Cl.
*H05B 3/28*    (2006.01)
*H05B 3/18*    (2006.01)
(Continued)

(52) U.S. Cl.
CPC ....... *H05B 3/283* (2013.01); *H01L 21/67103* (2013.01); *H05B 3/16* (2013.01);
(Continued)

(58) Field of Classification Search
None
See application file for complete search history.

(56) References Cited

U.S. PATENT DOCUMENTS 5,798,499 A    8/1998  Shibata et al.
6,616,767 B2   9/2003  Zhao et al.
(Continued)

FOREIGN PATENT DOCUMENTS

CN    101390444    3/2009
CN    100477076    4/2009
(Continued)

OTHER PUBLICATIONS

JP2002319474A, Oct. 2002, "Hot Plate Unit", Sugimoto et al, partial translation.*
(Continued)

*Primary Examiner* — Joseph M Pelham
(74) *Attorney, Agent, or Firm* — Klarquist Sparkman, LLP

(57) ABSTRACT

Provided is a heating wire arrangement for a ceramic heater, which is an arrangement of a heating wire on a ceramic substrate in a ceramic heater and emits heat. The heating wire arrangement for the ceramic heater includes a heating wire that is a metal wire member extending in a longitudinal direction and is two-dimensionally arranged on a virtual two-dimensional (2D) plane that is substantially parallel to a top surface of the ceramic substrate.

Thus, a uniform heat density may be maintained and a rapid temperature ramp-up may be enabled, unlike a conventional heating wire of a three-dimensional (3D) type.

3 Claims, 5 Drawing Sheets

(51) Int. Cl.
  H01L 21/67 (2006.01)
  H05B 3/16 (2006.01)
  H05B 3/74 (2006.01)
(52) U.S. Cl.
  CPC ............... *H05B 3/18* (2013.01); *H05B 3/748* (2013.01); *H05B 2203/014* (2013.01)

(56) References Cited

U.S. PATENT DOCUMENTS

| | | | |
|---|---|---|---|
| 7,053,339 B2 | 5/2006 | Goto | |
| 7,098,428 B1 | 8/2006 | Elliot et al. | |
| 7,247,817 B2 | 7/2007 | Okajima | |
| 2002/0153607 A1* | 10/2002 | Hiramatsu | H01L 21/67103 257/701 |
| 2003/0183616 A1 | 10/2003 | Goto | |
| 2004/0108308 A1 | 6/2004 | Okajima | |
| 2004/0112888 A1 | 6/2004 | Tachikawa et al. | |
| 2004/0149718 A1 | 8/2004 | Ito et al. | |
| 2004/0155025 A1 | 8/2004 | Ito et al. | |
| 2005/0173411 A1 | 8/2005 | Goto | |
| 2005/0258160 A1 | 11/2005 | Goto et al. | |
| 2006/0000822 A1* | 1/2006 | Nakamura | H01L 21/67103 219/409 |
| 2006/0096972 A1* | 5/2006 | Nakamura | H01L 21/67103 219/444.1 |
| 2008/0237216 A1 | 10/2008 | Goto | |
| 2010/0224620 A1 | 9/2010 | Shibata et al. | |

FOREIGN PATENT DOCUMENTS

| | | |
|---|---|---|
| JP | 2002-509989 | 9/2000 |
| JP | 2002-231421 | 8/2002 |
| JP | 2002-319474 | 10/2002 |
| JP | 2003-007432 | 1/2003 |
| JP | 2003077781 A * | 3/2003 |
| JP | 2003-234165 | 8/2003 |
| JP | 2004-006242 | 1/2004 |
| JP | 2006-127883 | 5/2006 |
| JP | 2008-270198 | 11/2008 |
| JP | 2004-111107 | 4/2014 |
| KR | 10-2006-0051861 | 5/2006 |
| WO | WO 01/28291 | 4/2001 |

OTHER PUBLICATIONS

International Search Report, issued in PCT/KR2013/004120, dated Aug. 28, 2013, 2 pages.
Written Opinion issued in PCT/KR2013/004120, dated Aug. 28, 2013, 6 pages.
Office Action from the Japanese Patent Office for related Japanese App. No. 2015-512570, dated Nov. 27, 2015, 4 pages.
Extended European Search Report from the European Patent Office for related European App. No. 13790758.0, dated Dec. 18, 2015, 9 pages.
Office Action from the State Intellectual Property Office of the People's Republic of China for related Chinese App. No. 201380038256.5, dated Aug. 24, 2015, 16 pages.

* cited by examiner

[Fig. 1]
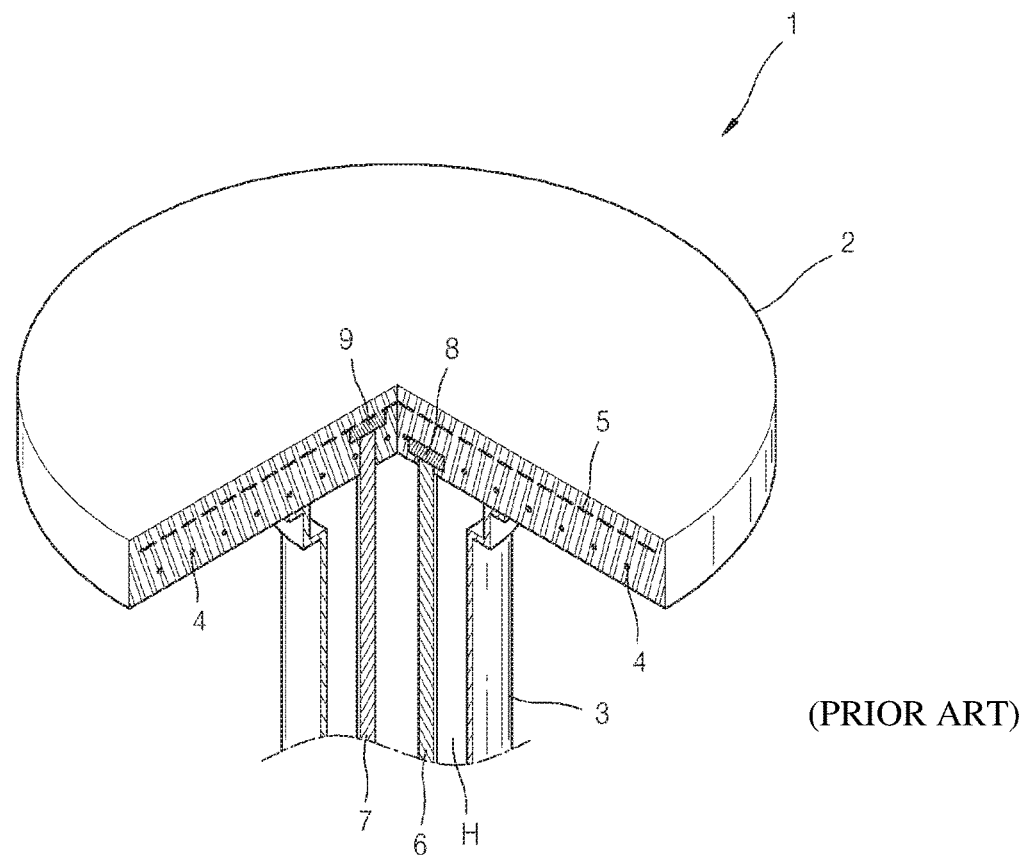
(PRIOR ART)
[Fig. 2]
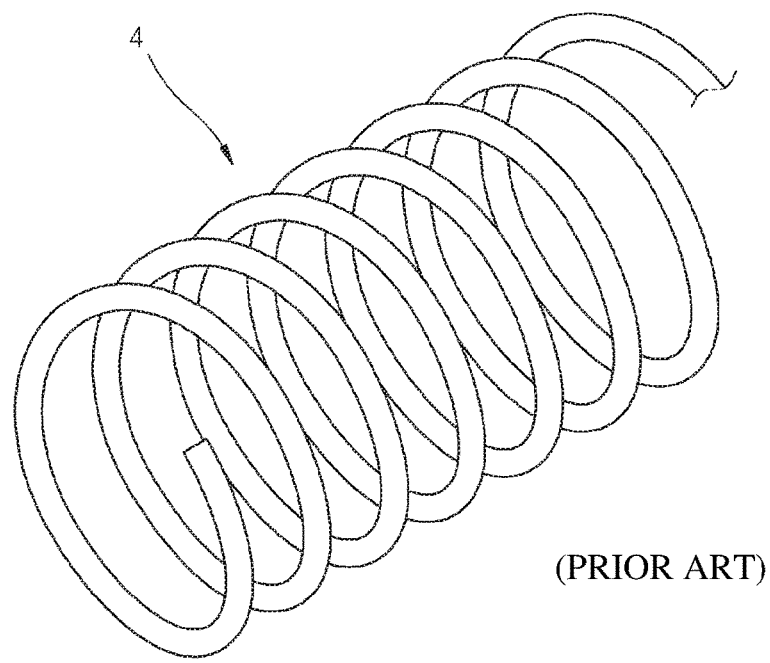
(PRIOR ART)

[Fig. 3]
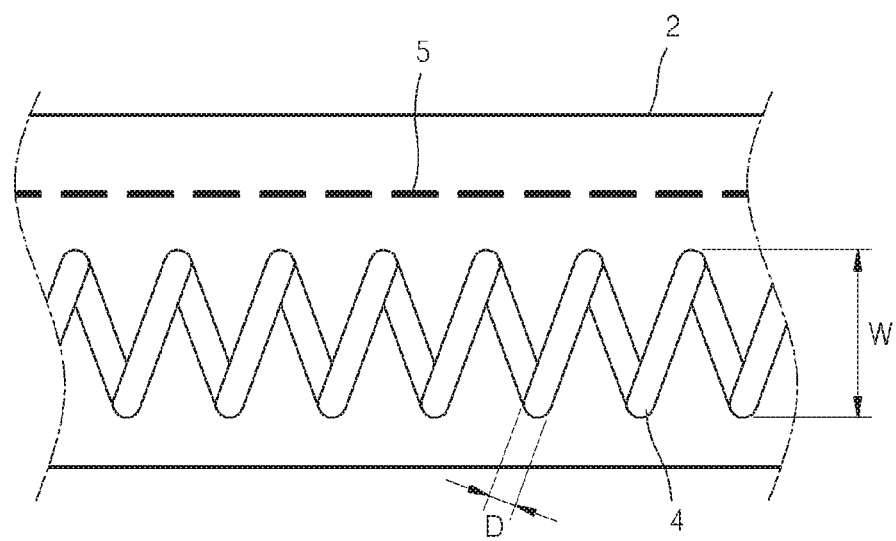
(PRIOR ART)

[Fig. 4]
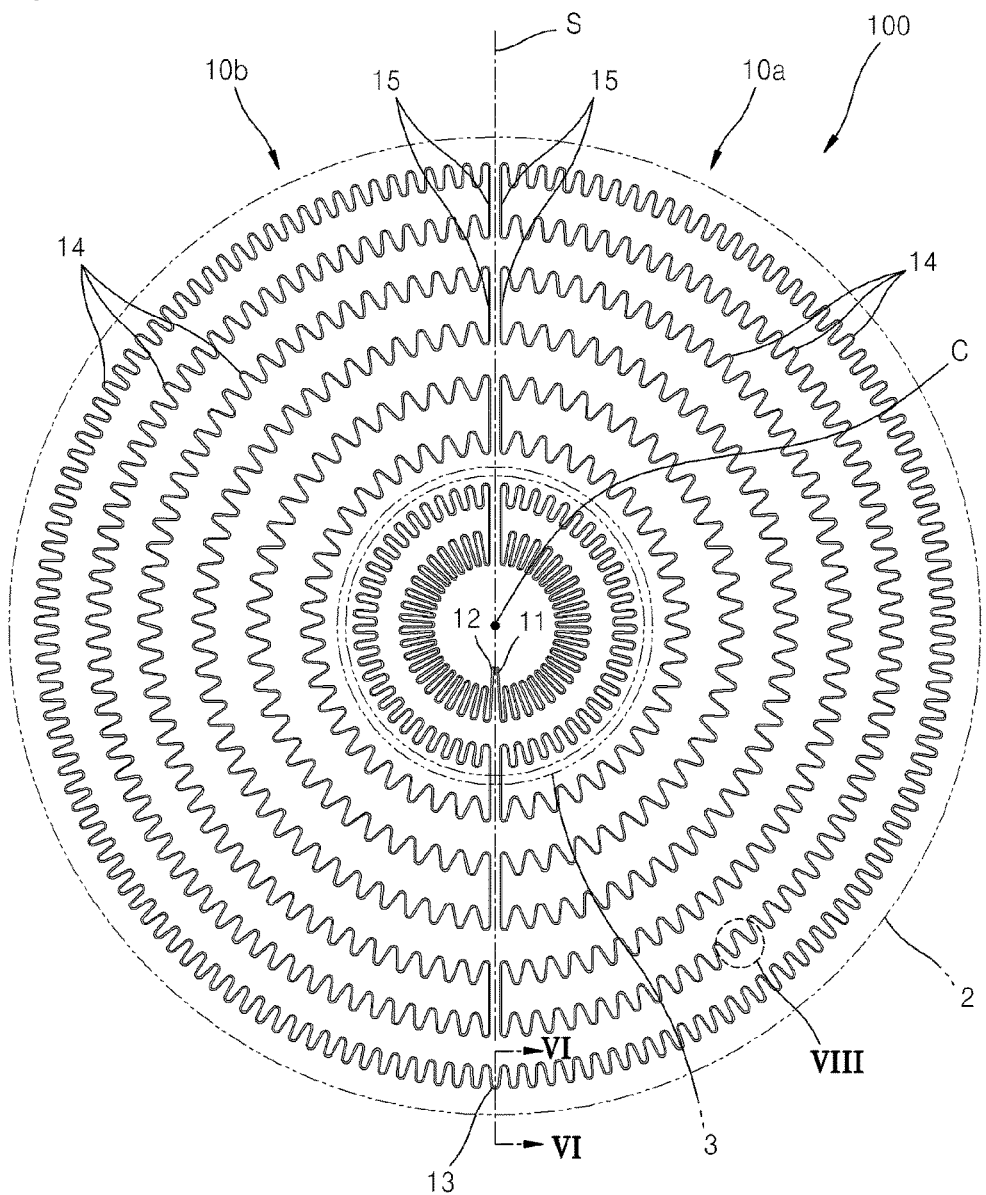

[Fig. 5]
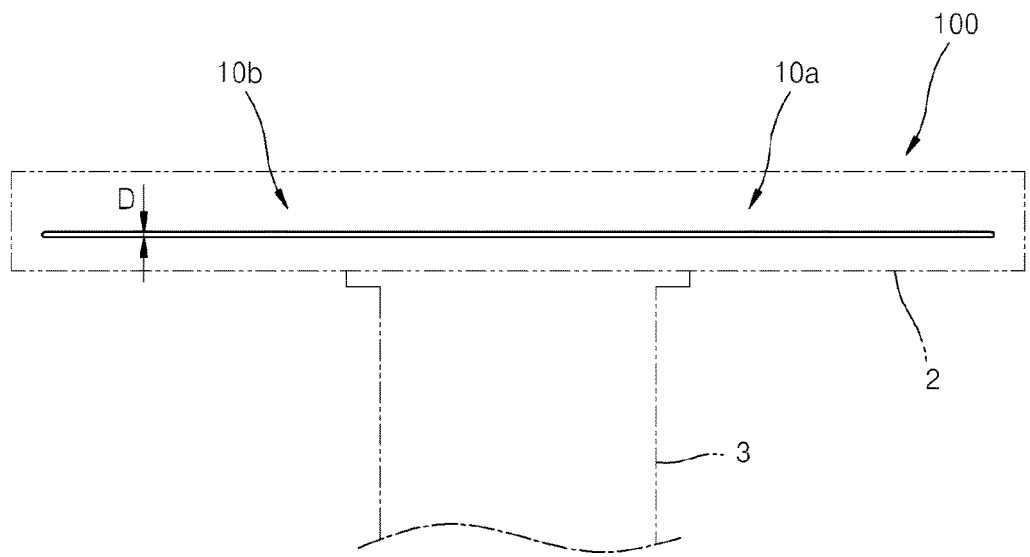
[Fig. 6]
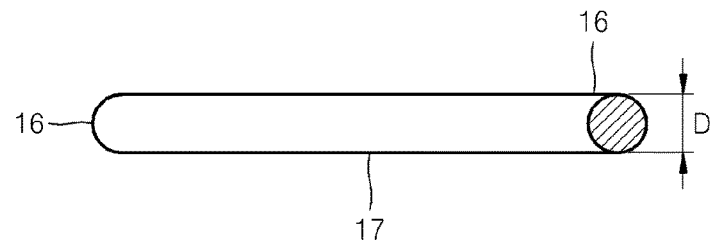
[Fig. 7]
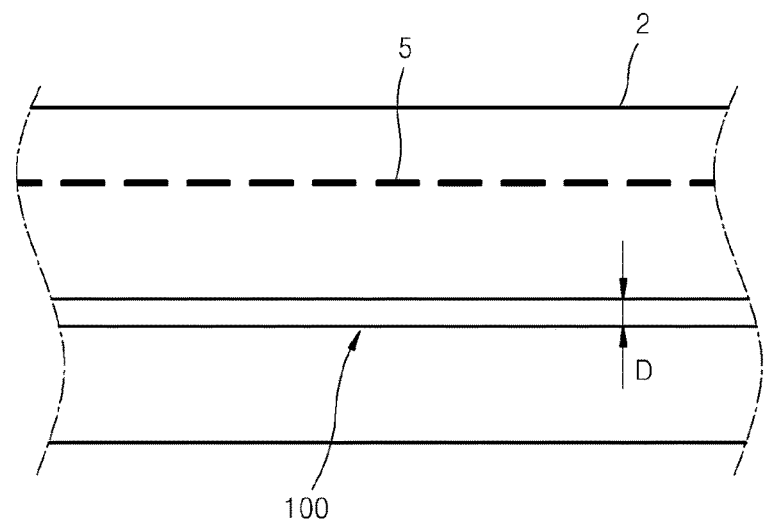

[Fig. 8]
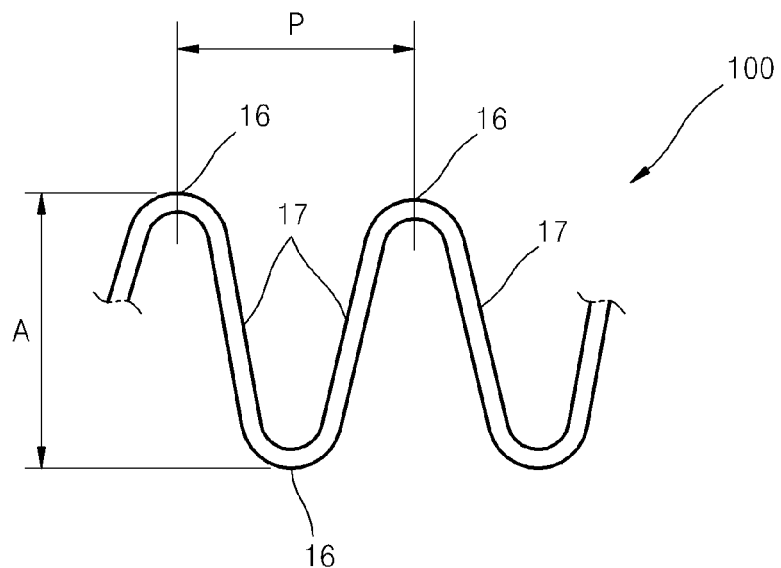
[Fig. 9]
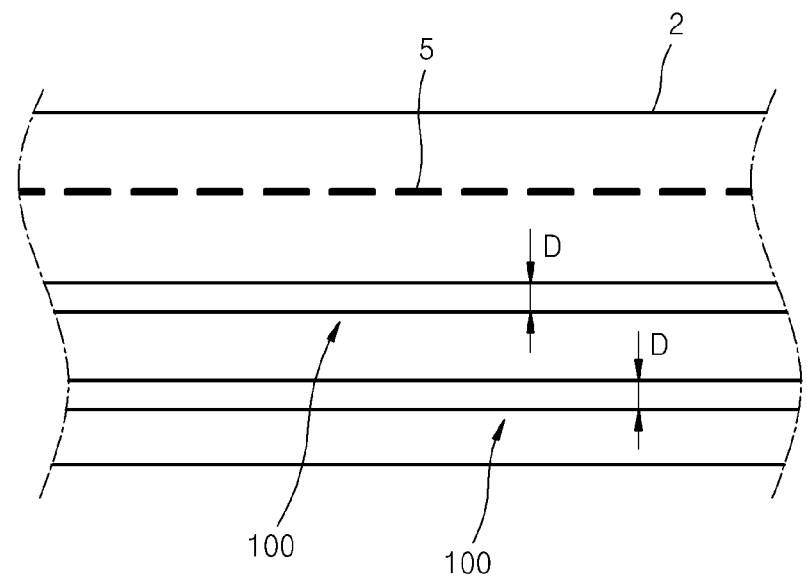

HEATING WIRE ARRANGEMENT FOR CERAMIC HEATER

CROSS REFERENCE TO RELATED APPLICATIONS

This is the U.S. National Stage of International Application No. PCT/KR13/004120, filed May 10, 2013, which was published in English under PCT Article 21(2), which in turn claims the benefit of Korean Patent Application No. 10-2012-0053160, filed May 18, 2012. Both applications are incorporated herein by reference in their entirety.

TECHNICAL FIELD

The inventive concept relates to a heating wire arrangement for a ceramic heater, and more particularly, to a heating wire for a ceramic heater that allows to maintain a uniform heat density and a rapid temperature ramp-up.

BACKGROUND ART

A ceramic heater is a device for heating a semiconductor wafer in a process of manufacturing a semiconductor. FIG. 1 shows an example of such a ceramic heater 1.

The ceramic heater 1 is formed to include a ceramic substrate 2 that is a circular flat-panel member manufactured by using a ceramic material such as aluminum nitride (AlN) or aluminum oxide ($Al_2O_3$), a hollow shaft 3 that is attached to a bottom surface of the ceramic substrate 2 and has a hole H inside the hollow shaft 3, a heating wire 4 that is a metal wire of a three-dimensional (3D) coil type and arranged inside the ceramic substrate 2 to emit heat, a static electricity-generating electrode 5 that is a mesh-shaped metal member arranged inside the ceramic substrate 2, and generates static electricity to adsorb the semiconductor wafer, a first electricity-supplying member 6 that is a rod member that is arranged in the hole H of the hollow shaft 3 and supplies electricity to the heating wire 4, a first connecting member 8 for connecting the first electricity-supplying member 6 to the heating wire 4, a second electricity-supplying member 7 that is a rod member that is arranged in the hole H of the hollow shaft 3 and supplies electricity to the static electricity-generating electrode 5, and a second connecting member 9 for connecting the second electricity-supplying member 7 to the static electricity-generating electrode 5. Accordingly, the ceramic heater 1 heats the semiconductor wafer by using the heating wire 4, and adsorbs and fixes the semiconductor wafer by using static electricity generated by the static electricity-generating electrode 5.

As shown in FIG. 2, the ceramic heater 1 conventionally includes the heating wire 4 of a 3D coil type, and it may be difficult to maintain a shape of the 3D coil due to shrinkage deformation of the ceramic substrate 2 that may occur during sintering of the ceramic substrate 2.

Additionally, it may be difficult to maintain a heat density, required to design the ceramic heater 1, uniformly over the whole ceramic substrate 2 due to characteristics of a 3D coil, and deformation of a shape of the 3D coil which may occur during sintering.

Additionally, as shown in FIG. 3, since the heating wire 4 of a 3D coil type has a shape of a 3D coil which has a greater thickness W compared to a diameter D of a cross section, generated heat spreads out in all directions. Accordingly, compared to a heating wire of a two-dimensional flat-surface type which generates the same amount of heat as that generated by the heating wire 4, an amount of heat generated in an upper direction, that is, in a direction necessary to heat the semiconductor wafer may be reduced.

Additionally, since the heating wire 4 of the 3D type has a shape of a 3D coil, a worker may not easily arrange the heating wire inside the ceramic substrate 2. Thus, the ceramic substrate 2 may have to be manufactured by using a powdered raw material.

In order to solve such problems of the heating wire 4 of the 3D coil type, a heating wire of a 2D flat surface type (not illustrated) which is manufactured in the form of a thin sheet by using metal paste was used.

However, although the heating wire in the shape of a thin sheet may implement a uniform heat density, since a method of manufacturing the same may be limited to etching, paste printing, or the like, the heating wire in the shape of a thin sheet may be manufactured to have only a small thickness. Thus, a physical connection of the heating wire to the first connecting member 8 may be worsened, and anticorrosion and durability of the heating wire may be worsened.

Additionally, when viewed from over the ceramic substrate 2, the heating wire in the form of a sheet has a larger top flat surface than the heating wire 4 of the 3D coil type. Accordingly, since the heating wire in the form of a sheet may have a smaller heat density per unit area compared to a heating wire that has the same cross section and the same length as the heating wire in the form of a sheet, the heating wire in the form of a sheet may have a slow temperature ramp-up speed.

Accordingly, there is a need to develop a heating wire for compensating for respective problems of the heating wire 4 of a 3D coil type and the heating wire in the form of a sheet.

DETAILED DESCRIPTION OF THE INVENTIVE CONCEPT

Technical Problem

The inventive concept provides a heating wire arrangement for a ceramic heater in which arrangement is enhanced so that a uniform heat density is maintained and a rapid temperature ramp-up is enabled.

Technical Solution

According to an aspect of the inventive concept, there is provided a heating wire arrangement for a ceramic heater, which is an arrangement of a heating wire in a ceramic substrate of a ceramic heater and emits heat, including a heating wire that is a metal wire member extending in a longitudinal direction and is two-dimensionally arranged on a virtual two-dimensional (2D) plane that is substantially parallel to a top surface of the ceramic substrate.

The heating wire may include: a plurality of curved parts disposed to misalignedly face each other in two rows; and a plurality of connection parts for connecting the plurality of curved parts to each other, and the heating wire is tortuously formed of the plurality of curved parts and the plurality of connection parts in a zigzag form.

Pitches of the heating wire may have a different value from each other according to a location of the heating wire in the ceramic substrate.

Amplitudes of the heating wire may respectively have a different value from each other according to a location of the heating wire in the ceramic substrate.

The ceramic substrate may be a circular flat plate and the heating wire may be disposed on a plurality of concentric circles having a center at a center of the ceramic substrate.

The amplitudes or the pitches of the heating wire may respectively have a different value from each other according to a location in which the heating wire are separated from the center of the ceramic substrate in a radial direction.

Both ends of the heating wire may be arranged in a location so as to connect to a hole of a hollow shaft attached to a bottom surface of the ceramic substrate.

The heating wire may be arranged in a multi-layered structure on 2D planes parallel to each other.

The heating wire may be a metal member having a thermal expansion coefficient that falls within an error range of $\pm 3.0*10^{-6}*K^{-1}$ with respect to a thermal expansion coefficient of the ceramic substrate.

Advantageous Effects

In the present invention, a heating wire arrangement for a ceramic heater includes a heating wire that is a metal wire member extending in a longitudinal direction and is two-dimensionally arranged in a virtual two-dimensional plane that is substantially parallel to a top surface of a ceramic substrate. Thus, a uniform heat density may be maintained and a rapid temperature ramp-up may be enabled.

DESCRIPTION OF THE DRAWINGS

FIG. 1 is a cross-sectional perspective view of a conventional ceramic heater;

FIG. 2 is a perspective view of a part of a heating wire shown in FIG. 1;

FIG. 3 is a cross-sectional view of the heating wire, shown in FIG. 2, which is inserted into a ceramic substrate;

FIG. 4 is a plan view of a heating wire arrangement for a ceramic heater according to an embodiment of the present invention;

FIG. 5 is a front view of a heating wire shown in FIG. 4;

FIG. 6 is a cross-sectional view of the heating wire, shown in FIG. 4, which is taken along a line VI-VI;

FIG. 7 is a cross-sectional view of the heating wire, shown in FIG. 4, which is inserted into a ceramic substrate;

FIG. 8 is a magnified view of an area VIII of the heating wire shown in FIG. 4; and FIG. 9 is a cross-sectional view of the heating wire, shown in FIG. 4, which is arranged in a multi-layered structure inside the ceramic substrate.

BEST MODE

Hereinafter, exemplary embodiments of the present invention will be described in detail with reference to the accompanying drawings.

FIG. 4 is a plan view of a heating wire arrangement for a ceramic heater according to an embodiment of the present invention, and FIG. 5 is a front view of the heating wire shown in FIG. 4.

Mode of the Inventive Concept

Hereinafter, exemplary embodiments of the present invention will be described in detail with reference to the accompanying drawings.

FIG. 4 is a plan view of a heating wire arrangement for a ceramic heater according to an embodiment of the present invention, and FIG. 5 is a front view of the heating wire shown in FIG. 4.

Referring to FIGS. 4 and 5, according to an embodiment of the present invention, the heating wire arrangement for the ceramic heater is an arrangement of a heating wire 100 used in a ceramic heater for heating a semiconductor wafer, and is formed to include the ceramic substrate 2, the hollow shaft 3, and a heating wire 100. Hereinafter, a description is provided assuming that the heating wire arrangement for the ceramic heater is used in the ceramic heater 1 shown in FIG. 1.

The ceramic substrate 2 is a circular flat-panel member manufactured by using a ceramic material such as aluminum nitride (AlN) having a thermal expansion coefficient of $4.4*10^{-6}*K^{-1}$ or aluminum oxide ($Al_2O_3$) having a thermal expansion coefficient of $8.0*10^{-6}*K^{-1}$. In the current embodiment, AlN is used.

The ceramic substrate 2 is manufactured by sintering a powdered raw material of the AlN at a high temperature equal to or greater than 1500° C.

As shown in FIG. 1, the hollow shaft 3 is a pipe-type ceramic member that has the hole H inside, and is attached to a bottom surface to the ceramic substrate 2 so that the hollow shaft 3 may be sealed. Accordingly, the hole H is isolated to be air-sealed from outside.

The heating wire 100 is a member that is arranged inside the ceramic substrate 2 and thus emits heat. The heating wire 100 is manufactured by bending a metal wire that extends in a longitudinal direction. As shown in FIG. 6, in the current embodiment, a wire having a round cross-section, which has a predetermined diameter D, is used.

The heating wire 100 is arranged inside the powdered raw material of the ceramic substrate 2 before sintering the ceramic substrate 2, and fixed to an inside of the ceramic substrate 2 by sintering the ceramic substrate 2.

The heating wire 100 may be manufactured by using conductive metal such as molybdenum (Mo) or tungsten (W). In the current embodiment, the heating wire 100 is manufactured by using Mo. The Mo has a thermal expansion coefficient of $5.1*10^{-6}*K^{-1}$, and the W has a thermal expansion coefficient of $5.4*10^{-6}*K^{-1}$.

Accordingly, a thermal expansion coefficient of the heating wire 100 has a value that falls within an error range of $\pm 3.0*10^{-6}*K^{-1}$ with respect to a thermal expansion coefficient of the ceramic substrate 2.

As shown in FIGS. 5 and 7, the heating wire 100 is two-dimensionally arranged to be fixed to a virtual 2D plane that is substantially parallel to a top surface of the ceramic substrate 2. The heating wire 100 is arranged not to protrude from the 2D plane so that an arrangement thickness D of the heating wire 100 has the same value as a value of the diameter D of the heating wire 100. In the present invention, the virtual 2D plane does not always mean a mathematically perfect plane.

As shown in FIG. 4, the heating wire 100 includes a right-half part 10a that is arranged in a right-half surface of the ceramic substrate 2 and a left-half part 10b that is arranged in a left-half surface of the ceramic substrate 2, with reference to a separation line S.

In the current embodiment, the heating wire 100 is manufactured by bending one wire without having to perform additional binding work.

The right-half part 10a and the left-half part 10b include a plurality of arcs 14 arranged on a plurality of concentric circles respectively having a center at a center C of the ceramic substrate 2, and a plurality of connection parts 15 for connecting the plurality of arcs 14 to each other which are arranged on different concentric circles.

An end 11 of the right-half part 10a and an end 12 of the left-half part 10b are parts that are connected to the first connecting member 8 to receive electricity, and arranged near the center C of the ceramic substrate 2 so as to connect to an inside of the hole H of the hollow shaft 3.

The other end of the right-half part 10a and the other end of the left-half part 10b are connected to each other at a connection point 13 that is placed at an outermost boundary of the ceramic substrate 2.

As shown in FIG. 4, the heating wire 100 is tortuously formed to have a zigzag form. As shown in FIG. 8, the zigzag form of the heating wire 8 is formed of a plurality of curved parts 16 that are disposed to misalignedly face each other in two rows, and a plurality of connection parts 17 that are disposed in different rows and adjacent to each other so as to connect the plurality of curved parts 25 to each other.

Respective pitches P of the heating wire 100, that is, respective distances between the plurality of curved parts 16 that are disposed to be adjacent to each other in the same row may have a different value from each other according to a respective location in which curved parts 16 are arranged on the ceramic substrate 2.

In the current embodiment, the pitches P of the heating wire 100 have a different value from each other according to a location in which curved parts 16 are separated from the center C of the ceramic substrate 2 in a direction of a radius. As shown in FIG. 4, this may be checked from the pitches P of the heating wire 100 near the center C of the ceramic substrate 2 which are smaller than the pitches P of a remaining part of the heating wire 100. However, the pitches P of the heating wire 100 have the same value at the same concentric circle.

Amplitudes A of the heating wire 100, that is, distances between peaks of the plurality of curved parts 16 that are disposed to face each other in two rows may have a different value from each other according to a respective location in which curved parts 16 are arranged on the ceramic substrate 2.

In the current embodiment, the amplitudes A of the heating wire 100 have a different value from each other according to a location in which curved parts 16 are separated from the center C of the ceramic substrate 2 in a direction of a radius. As shown in FIG. 4, this may be checked from the amplitudes A of the heating wire 100 nearest the center C of the ceramic substrate 2 which are smaller than the amplitudes A of a remaining part of the heating wire 100. However, the amplitudes A of the heating wire 100 have the same value at the same concentric circle.

The heating wire arrangement for a ceramic heater, described above, includes the heating wire 100 that is a metal wire that extends in a longitudinal direction and is arranged on a virtual 2D plane that is substantially parallel to a top surface of the ceramic substrate 2. Accordingly, unlike the conventional heating wire 4 of a 3D coil type, a sufficient amount of heat may be generated in a direction necessary to heat the semiconductor wafer, that is, in a direction toward a top surface of the ceramic substrate 2, and a uniform heat density may be maintained and a rapid temperature ramp-up may be enabled.

Additionally, since the heating wire 100 is arranged on a 2D plane, only an arrangement of the heating wire 100 on a 2D plane may need to be taken into consideration, unlike the conventional heating wire 4 in the form of a 3D coil of which arrangement on a 3D space needs to be determined. Accordingly, an arrangement shape and a diameter D of the heating wire 100 for achieving a uniform heat density may be easily determined.

Additionally, the heating wire 100 may be tortuously formed in a zigzag pattern to include the plurality of curved parts 16 that are disposed to misalignedly face each other in two rows, and the plurality of connection parts 17 for connecting the plurality of curved parts 17 to each other. Accordingly, the heating wire 100 may be compactly and uniformly distributed on the ceramic substrate 2, and thus, a cold spot may be minimized.

Additionally, since the heating wire 100 is a metal wire arranged in a 2D plane, the heating wire 100 may be arranged not only inside a powdered raw material but also on the ceramic substrate 2 that is already sintered, unlike the heating wire 4 of a 3D coil-type that needs to be arranged inside a powdered raw material of the ceramic substrate 2.

Additionally, the amplitudes A or the pitches P of the heating wire 100 may respectively have a different value according to a respective location in which the curved parts 16 are arranged on the ceramic substrate 2. Accordingly, an arrangement density of the heating wire may be easily adjusted according to an arrangement location.

Additionally, the heating wire 100 may be arranged on a plurality of concentric circles having a center thereof at the center C of the ceramic substrate 2. Thus, it may be easy to arrange the heating wire 100 on the ceramic substrate 2 that is a circular flat panel.

The pitches P or the amplitudes A of the heating wire 100 may have a different value from each other according to a location in which the curved parts 16 are separated from the center C of the ceramic substrate 2 in a direction of a radius thereof. Thus, a heat density may be adjusted according to a location of the curved parts 16 in a direction from the center C of the ceramic substrate 2 to a radius thereof.

Additionally, both ends 11 and 12 of the heating wire 100 are arranged near the center C of the ceramic substrate 2 so as to connect to the hole H of the hollow shaft 3 attached to a bottom surface of the ceramic substrate 2. Thus, both ends 11 and 12 may be electrically connected to the first electricity-supplying member 6 disposed inside the hole H of the hollow shaft 3.

The heating wire 100 is a metal member that has a thermal expansion coefficient that falls within an error range of $\pm 3.0*10^{-6}*K^{-1}$ with respect to a thermal expansion coefficient of the ceramic substrate 2. Thus, even when the heating wire 100 is heat-expanded by heat generated when the ceramic heater 1 is manufactured or used, the ceramic substrate 2 may not be destroyed by a thermal stress.

In the current embodiment, the heating wire 100 is arranged on a single layer on the ceramic substrate 2. However, as shown in FIG. 9, the heating wire 100 may be arranged in a multi-layered structure on virtual 2D planes parallel to each other. In this case, an arrangement density and a heat density of the heating wire 100 may be enhanced.

While the inventive concept has been particularly shown and described with reference to exemplary embodiments thereof, it will be understood that various changes in form and details may be made therein without departing from the spirit and scope of the following claims.

The invention claimed is:

1. A heating wire arrangement for a ceramic heater which is an arrangement of a heating wire in a ceramic substrate of a ceramic heater and emits heat, the heating wire arrangement for the ceramic heater comprising a heating wire two-dimensionally arranged on a virtual two-dimensional (2D) plane that is substantially parallel to a top surface of the ceramic substrate;

wherein the heating wire is formed in a zigzag form;
amplitudes or pitches of the heating wire respectively have a different value from each other according to a location in which the heating wire are separated from the center of the ceramic substrate in a radial direction;

the ceramic substrate is a circular flat plate;
the heating wire is disposed on a plurality of concentric circles having a center at a center of the ceramic substrate;
the heating wire is a metal wire member of a circular cross-section, and an arrangement thickness of the heating wire in the ceramic substrate has the same value as a value of a diameter of the heating wire,
both ends of the heating wire are arranged near the center of the ceramic substrate so as to connect to the hole of the hollow shaft attached to the center of a bottom surface of the ceramic substrate;
the both ends of the heating wire are electrically connected to a first electricity-supplying member disposed inside the hole of the hollow shaft;
when the inner side of the hollow shaft coupled to the ceramic substrate is referred to as an inner region and the outer side of the hollow shaft is referred to as an outer region,
pitch of the heating wire disposed in at least one of the concentric circles arranged in the inner region is smaller than the pitch of the heating wires disposed in the outer region, and
amplitude of the heating wire disposed in at least one of the concentric circles arranged in the inner region is larger than the amplitude of the heating wires arranged in the outer region.

2. The heating wire arrangement for the ceramic heater of claim 1, wherein the heating wire is arranged in a multi-layered structure on 2D planes parallel to each other.

3. The heating wire arrangement for the ceramic heater of claim 1, wherein the heating wire is a metal member having a thermal expansion coefficient that falls within an error range of $\pm 3.0*10-6*K-1$ with respect to a thermal expansion coefficient of the ceramic substrate.

* * * * *